(12) United States Patent
Watanabe et al.

(10) Patent No.: US 9,040,984 B2
(45) Date of Patent: May 26, 2015

(54) TRANSISTOR WITH ZRO OR HFO GATE INSULATOR SANDWICHED BETWEEN TWO SIO OR AIO GATE INSULATORS OVER AN OXIDE SEMICONDUCTOR FILM

(71) Applicant: Semiconductor Energy Laboratory Co., Ltd., Atsugi-shi, Kanagawa-ken (JP)

(72) Inventors: Hirokazu Watanabe, Isehara (JP); Shinji Ohno, Sapporo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/077,371

(22) Filed: Nov. 12, 2013

(65) Prior Publication Data

US 2014/0131701 A1 May 15, 2014

(30) Foreign Application Priority Data

Nov. 15, 2012 (JP) .................................. 2012-250989

(51) Int. Cl.
*H01L 29/786* (2006.01)
*H01L 29/49* (2006.01)

(52) U.S. Cl.
CPC ........ *H01L 29/7869* (2013.01); *H01L 29/4908* (2013.01)

(58) Field of Classification Search
CPC .......................... H01L 27/1225; H01L 29/7869
USPC ....................................................... 257/43, 57
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

International Search Report (Application No. PCT/JP2013/080369) Dated Dec. 10, 2013.

(Continued)

*Primary Examiner* — Thomas L Dickey
(74) *Attorney, Agent, or Firm* — Eric J. Robinson; Robinson Intellectual Property Law Office, P.C.

(57) ABSTRACT

To provide a semiconductor device which includes a gate insulating film with high withstand voltage and thus can have high reliability. The semiconductor device includes an oxide semiconductor film over an insulating surface; a pair of first conductive films over the oxide semiconductor film; a first insulating film, a second insulating film, and a third insulating film which are stacked in this order over the oxide semiconductor film and the pair of first conductive films; and a second conductive film overlapping with the oxide semiconductor film over the first to third insulating films. The first insulating film and the third insulating film contain silicon oxide, silicon nitride, silicon oxynitride, silicon nitride oxide, aluminum oxide, or aluminum oxynitride. The second insulating film contains gallium oxide, zirconium oxide, or hafnium oxide.

17 Claims, 10 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 8,518,761 B2 | 8/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0193079 A1* | 8/2011 | Endo et al. .................. 257/43 |
| 2011/0256673 A1 | 10/2011 | Yamazaki et al. |
| 2012/0049183 A1 | 3/2012 | Yamazaki |
| 2012/0195115 A1* | 8/2012 | Fujita et al. ................ 365/182 |
| 2012/0248432 A1 | 10/2012 | Noda et al. |
| 2012/0248433 A1 | 10/2012 | Nakano et al. |
| 2013/0320334 A1 | 12/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 | 6/2006 |
| JP | 2012-216787 A | 11/2012 |
| JP | 2012-216834 A | 11/2012 |
| KR | 2012-0110034 A | 10/2012 |
| KR | 2012-0112228 A | 10/2012 |
| TW | 201242030 | 10/2012 |
| TW | 201301516 | 1/2013 |
| WO | WO-2004/114391 | 12/2004 |

OTHER PUBLICATIONS

Written Opinion (Application No. PCT/JP2013/080369) Dated Dec. 10, 2013.

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Tretment,", Appl. Phys. Lett (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, p. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Let. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vo. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Material), 2005, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2008, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,". AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technial Papers, May 31, 2008, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technial Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors ZnO (TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 281-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Ppaers, May 31, 2009, pp. 578-581.

(56) References Cited

OTHER PUBLICATIONS

Asaoka.Y et al., "29.1:Polarizer-Free Reflective LCD Combined With Ultra Low-Power Driving Technology,", SID Digest '09 : SID International Symposium Digest of Technical Papers, May 31, 209, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—Bo Systems [A, Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

TRANSISTOR WITH ZRO OR HFO GATE INSULATOR SANDWICHED BETWEEN TWO SIO OR AIO GATE INSULATORS OVER AN OXIDE SEMICONDUCTOR FILM

TECHNICAL FIELD

The present invention relates to a semiconductor device, particularly to a semiconductor device using an oxide semiconductor.

BACKGROUND ART

A technique by which transistors are formed using thin semiconductor films formed over a substrate having an insulating surface has been attracting attention. The transistor is applied to a wide range of electronic devices such as an integrated circuit (IC). A silicon-based semiconductor material is widely known as a material for a semiconductor thin film applicable to a transistor. As another material, an oxide semiconductor has been attracting attention.

For example, a transistor including a semiconductor thin film which includes an amorphous oxide containing indium (In), gallium (Ga), and zinc (Zn) (an In—Ga—Zn—O-based amorphous oxide) is disclosed (see Patent Document 1). In particular, when the indium content in an oxide semiconductor film is made higher, the mobility of the transistor including the oxide semiconductor film can be increased.

REFERENCE

Patent Document

[Patent Document 1] Japanese Published Patent Application No. 2006-165529

DISCLOSURE OF INVENTION

However, when an insulating film containing silicon, which is generally used as a gate insulating film, is provided over an oxide semiconductor film containing indium, indium contained in the oxide semiconductor film is diffused into the insulating film in some cases. When indium is diffused into a gate insulating film containing silicon, the withstand voltage of the gate insulating film is lowered, and thus the reliability of a transistor including the gate insulating film is lowered.

In view of the foregoing technical background, an object of one embodiment of the present invention is to provide a semiconductor device which includes a gate insulating film with high withstand voltage and thus can have high reliability.

In order to achieve the above object, in one embodiment of the present invention, as a material of a gate insulating film of a transistor including a channel formation region in an oxide semiconductor film, a metal oxide which can keep a sufficiently high withstand voltage even when a metal contained in an oxide semiconductor, such as indium, enters the metal oxide is used. As the metal oxide, gallium oxide, zirconium oxide, hafnium oxide, or the like is preferably used.

Further, in one embodiment of the present invention, an insulating film (hereinafter, referred to as a protective film) which can prevent oxygen from being extracted from an insulating film containing a metal oxide to a conductive film which contains metal and serves as a gate electrode, a source electrode, or a drain electrode is provided between the insulating film and the conductive film. Specifically, in one embodiment of the present invention, a gate insulating film has a structure in which a first protective film, an insulating film containing a metal oxide, and a second protective film are stacked in this order.

With one embodiment of the present invention, a semiconductor device which includes a gate insulating film with high withstand voltage and thus can have high reliability can be provided.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Note that the present invention includes, in its category, all the semiconductor devices in which transistors are used: for example, integrated circuits, RF tags, and semiconductor display devices. The integrated circuits include, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). The semiconductor display devices include, in its category, semiconductor display devices in which a circuit element including a semiconductor film is included in a driver circuit, such as liquid crystal display devices, light-emitting devices in which a light-emitting element typified by an organic light-emitting element (OLED) is provided for each pixel, electronic papers, digital micromirror devices (DMDs), plasma display panels (PDPs), field emission displays (FEDs), and the like.

Embodiment 1

Structural Example 1 of Transistor

Figure 1A:
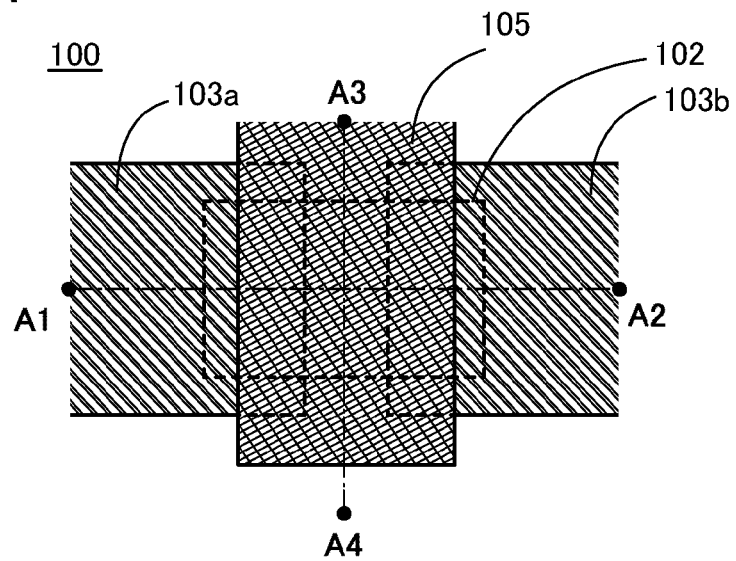
FIGS. 1A to 1C are a plan view and cross-sectional views illustrating one embodiment of a semiconductor device.
Figure 1B:
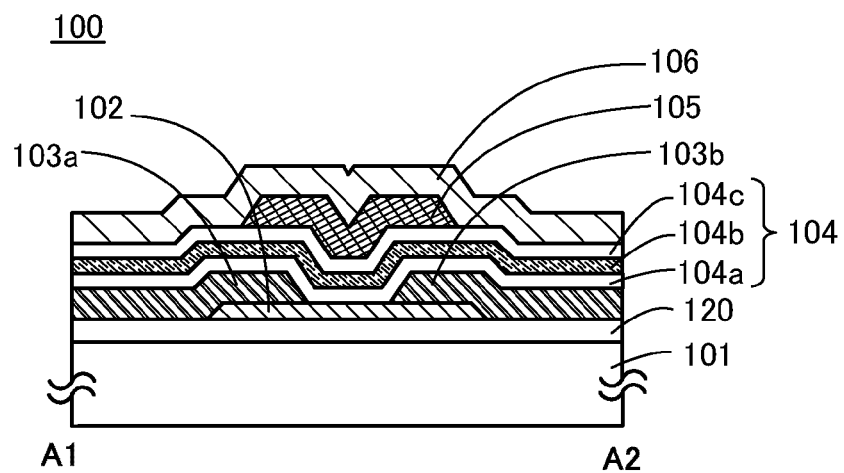
Figure 1C:
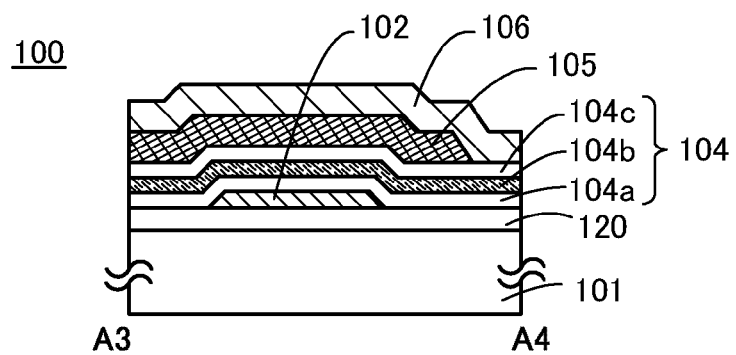

A structural example of a transistor included in a semiconductor device of one embodiment of the present invention will be described with reference to FIGS. 1A to 1C. FIG. 1A is a top view of a transistor 100. FIG. 1B and FIG. 1C are cross-sectional views of the transistor 100 illustrated in FIG. 1A, which are taken along chain line A1-A2 and chain line A3-A4, respectively. Note that various insulating films including a gate insulating film are omitted in the top view of FIG. 1A for a simple layout of the transistor 100.

The transistor 100 illustrated in FIGS. 1A to 1C includes, over a substrate 101 where an insulating film 120 is formed, a semiconductor film 102 including an oxide semiconductor; a conductive film 103a and a conductive film 103b which are provided over and in contact with the semiconductor film 102, one of which serves as a source electrode, the other of which serves as a drain electrode; a gate insulating film 104 over the semiconductor film 102, the conductive film 103a, and the conductive film 103b; and a conductive film 105 which is positioned over the gate insulating film 104 so as to overlap with the semiconductor film 102 and serves as a gate electrode.

FIGS. 1B and 1C illustrate a structure in which an insulating film 106 is provided over the transistor 100 as an example. The insulating film 106 may be included in the transistor 100.

Further, in FIGS. 1A to 1C, the insulating film 120 is not necessarily provided. However, in the case where the substrate 101 contains an impurity such as an alkali metal or an alkaline earth metal, provision of the insulating film 120 between the substrate 101 and the semiconductor film 102 can prevent the impurity from entering the semiconductor film 102. An alkali metal or an alkaline earth metal is bonded to an oxide semiconductor to generate carriers in some cases; therefore, provision of the insulating film 120 can prevent an increase in the off-state current of the transistor 100 due to the carriers.

In one embodiment of the present invention, the gate insulating film 104 includes at least a protective film 104a, an insulating film 104b containing a metal oxide, and a protective film 104c, which are stacked in this order. That is, the gate insulating film 104 has a structure in which the insulating film 104b is interposed between the protective film 104a and the protective film 104c. Therefore, in the transistor 100, the protective film 104a exists between the insulating film 104b and the conductive films 103a and 103b, and thus the insulating film 104b is not in contact with the conductive film 103a and the conductive film 103b. Further, in the transistor 100, the protective film 104c exists between the insulating film 104b and the conductive film 105, and thus the insulating film 104b is not in contact with the conductive film 105.

The insulating film 104b is formed using a metal oxide which can keep a sufficiently high withstand voltage even when a small amount of a metal such as indium in the semiconductor film 102 enters the metal oxide. The metal oxide is preferably a metal oxide containing gallium oxide, zirconium oxide, or hafnium oxide. Further, an oxide containing zinc in addition to gallium, zirconium, or hafnium, such as a Ga—Zn-based oxide, may be used. The use of the insulating film 104b described above for the gate insulating film 104 can prevent the withstand voltage of the insulating film 104b from being lowered even when a metal such as indium enters the insulating film 104b through the protective film 104a or the protective film 104c.

Further, as each of the protective film 104a and the protective film 104c, an insulating film which can prevent oxygen in the insulating film 104b from being extracted by the conductive film 103a, the conductive film 103b, or the conductive film 105 is used. For example, as each of the protective film 104a and the protective film 104c, an insulating film containing silicon oxide, silicon nitride, silicon oxynitride, silicon nitride oxide, aluminum oxide, aluminum oxynitride, or the like can be used.

Note that in this specification, oxynitride contains more oxygen than nitrogen, and nitride oxide contains more nitrogen than oxygen.

In the insulating film 104b containing a metal oxide, when the oxygen content is reduced, the number of oxygen vacancies is increased, and thus the number of donors generated owing to the oxygen vacancies is also increased, and the withstand voltage of the insulating film 104b is easily lowered. However, in one embodiment of the present invention, the protective film 104a is provided between the insulating film 104b and the conductive films 103a and 103b, and the protective film 104c is provided between the insulating film 104b and the conductive film 105, whereby oxygen in the insulating film 104b can be prevented from being extracted, and the withstand voltage of the insulating film 104b can be prevented from being lowered.

Accordingly, in one embodiment of the present invention, the gate insulating film 104 includes at least the protective film 104a, the insulating film 104b, and the protective film 104c, which are stacked in this order; thus, the transistor 100 can have higher withstand voltage than a transistor in which a gate insulating film includes only an insulating film whose withstand voltage is lowered owing to entry of indium, such as an silicon oxide film.

Further, gallium oxide, zirconium oxide, and hafnium oxide each have a higher dielectric constant than silicon oxide, and thus can prevent an increase in current (leakage current) flowing between the gate electrode and the semiconductor film through the gate insulating film due to miniaturization of the transistor 100. In particular, zirconium oxide and hafnium oxide each have an extremely higher dielectric constant than silicon oxide; therefore, an increase in leakage current due to miniaturization can be suppressed more effectively in a transistor in which a gate insulating film includes a zirconium oxide film or a hafnium oxide film than in a transistor in which a gate insulating film includes only a silicon oxide film.

<Fabrication Method of Transistor>

Next, an example of a fabrication method of the transistor 100 will be described with reference to FIGS. 2A to 2D.

As the substrate 101, a substrate which is heat resistant to a processing temperature in a later fabrication step is used. For example, a glass substrate, a ceramic substrate, a quartz substrate, a sapphire substrate, or the like can be used as the substrate 101. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like can be used. Further alternatively, a substrate already provided with a semiconductor element may be used as the substrate 101.

The insulating film 120 has a function of preventing entry of an impurity in the substrate 101 into the semiconductor film 102 which is to be formed later, and also has a function of supplying oxygen to the semiconductor film 102. Accordingly, a material of the insulating film 120 is preferably an oxide, and for example, aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, or the like can be used. The insulating film 120 can be formed by a plasma CVD (chemical vapor deposition) method, a sputtering method, or the like.

Oxygen may be implanted into the insulating film 120 by an ion implantation method, an ion doping method, a plasma immersion ion implantation method, or the like. By implantation of oxygen, the insulating film 120 can contain oxygen with a higher proportion than a proportion of oxygen in the stoichiometric composition.

Figure 2A:
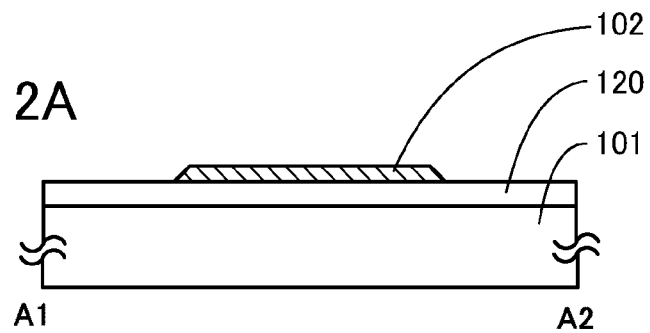
FIGS. 2A to 2D are cross-sectional views illustrating one embodiment of a fabrication method of a semiconductor device.

Next, an oxide semiconductor film is formed over the insulating film 120 and selectively etched to form the semiconductor film 102 (see FIG. 2A).

An oxide semiconductor that can be used for the semiconductor film 102 preferably contains at least indium (In) or zinc (Zn). Alternatively, the oxide semiconductor preferably contains both In and Zn. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, In—Ga—Zn-based oxide with an atomic ratio where In:Ga:Zn=1:1:1, In:Ga:Zn=3:1:2, or In:Ga:Zn=2:1:3, or an oxide whose composition is in the neighborhood of the above compositions can be used.

An oxide semiconductor film used for the semiconductor film 102 is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, a change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

Sputtering may be performed to form an oxide semiconductor film including a CAAC-OS film. In order to obtain a CAAC-OS film by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made to be longer (e.g., 150 mm to 200 mm) and a substrate heating temperature be 100° C. to 500° C., further preferably 200° C. to 400° C., still preferably 250° C. to 300° C. In addition to this, the deposited oxide semiconductor film is subjected to heat treatment at a temperature higher than the substrate heating temperature in the deposition. Thus, micro-defects in the film and defects at the interface of a stacked layer can be compensated.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Note that if the oxide semiconductor film forming the semiconductor film 102 contains a large amount of hydrogen, the hydrogen and the oxide semiconductor are bonded to each other, so that part of the hydrogen is likely to serve as a donor and cause generation of an electron which is a carrier. By the generation of an electron, the threshold voltage of the transistor shifts in the negative direction. Therefore, first heat treatment is preferably performed at a timing which is after the oxide semiconductor film is formed over the insulating film 120 and before the semiconductor film 102 is formed by etching. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. By the first heat treatment, hydrogen or moisture can be removed from the oxide semiconductor film, and oxygen in the insulating film 120 can be supplied to the oxide semiconductor film to fill oxygen vacancies. By the first heat treatment, the crystallinity in the oxide semiconductor film can be increased. Note that the first heat treatment may be performed in such a manner that heat treatment is performed in an inert gas atmosphere, and then another heat treatment is performed in an atmosphere containing an oxidizing gas at 10 ppm or more. In the above manner, the amount of oxygen supplied to the oxide semiconductor film can be increased, and the number of oxygen vacancies can be further reduced.

Note that the first heat treatment may be performed after the semiconductor film 102 is formed by etching.

The semiconductor film 102 which is thus highly purified by removal of hydrogen or moisture and filling of oxygen vacancies is an i-type (intrinsic) or substantially i-type semiconductor film. Thus, the transistor 100 including a channel formation region in the highly-purified semiconductor film 102 has extremely low off-state current and high reliability.

Specifically, various experiments can prove a low off-state current of a transistor having a channel formation region in a highly purified oxide semiconductor. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In that case, it can be seen that the off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a purified oxide semiconductor film has been used for a channel formation region of the transistor, and an off-state current of the transistor has been measured from a change in the amount of charge of the capacitor per unit time. As a result, it was found that, in the case where the voltage between the source electrode and the drain electrode of the transistor is 3 V, a lower off-state current of several tens of yA/μm is obtained. Accordingly, the off-state current of the transistor in which the purified oxide semiconductor film is used as a channel formation region is considerably lower than that of a transistor in which silicon having crystallinity is used.

Figure 2B:
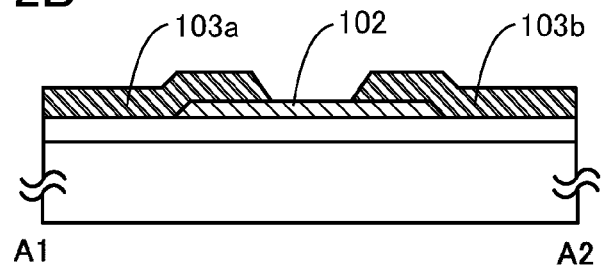

Next, a conductive film is formed over the semiconductor film 102 and then processed into a desired shape by etching or the like to form the conductive film 103a and the conductive film 103b which serve as a source electrode and a drain electrode (see FIG. 2B). The conductive film 103a and the conductive film 103b can be formed using a conductive film including a metal material such as molybdenum, titanium, chromium, tantalum, tungsten, aluminum, copper, neodymium, scandium, or niobium, or an alloy material which contains any of these metal materials as a main component.

Figure 2C:
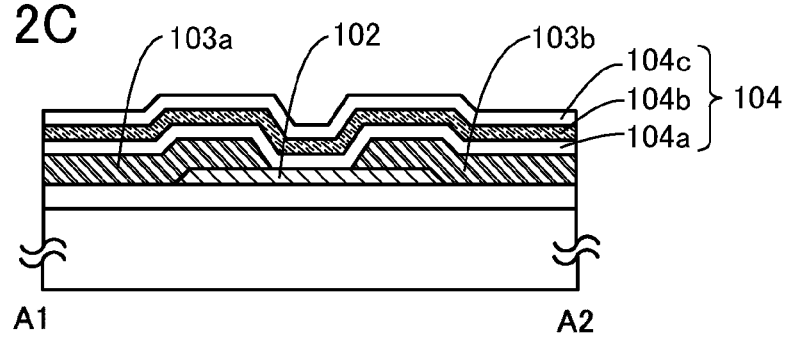

Next, the gate insulating film 104 is formed in such a manner that the protective film 104a, the insulating film 104b, and the protective film 104c are stacked in this order over the insulating film 120, the semiconductor film 102, and the conductive films 103a and 103b (see FIG. 2C).

Specifically, as each of the protective film 104a and the protective film 104c, an insulating film containing silicon oxide, silicon nitride, silicon oxynitride, silicon nitride oxide, aluminum oxide, aluminum oxynitride, or the like can be used. The protective film 104a and the protective film 104c can be formed using a sputtering method, a CVD method, or the like as appropriate.

Further, the insulating film 104b is formed using a metal oxide which can keep a sufficiently high withstand voltage even when a small amount of a metal such as indium in the semiconductor film 102 enters the metal oxide. As the metal oxide, for example, gallium oxide, zirconium oxide, hafnium oxide, or the like is preferably used. Further, an oxide containing zinc in addition to gallium, zirconium, or hafnium, such as a Ga—Zn-based oxide, may be used.

The insulating film 104b can be formed using a sputtering method, a CVD method, or the like as appropriate.

Further, it is preferable that the protective film 104a, the insulating film 104b, and the protective film 104c be formed successively without exposure to the air because an impurity can be prevented from entering an interface between the films.

An example of a specific formation method in which the protective film 104a, the insulating film 104b, and the protective film 104c are formed using silicon oxide, gallium oxide, and silicon oxide, respectively will be described. First, the protective film 104a which contains silicon oxide and has a thickness of 10 nm is formed by a sputtering method under the following conditions: silicon oxide is used as a target; the flow rate of oxygen is 50 sccm; the deposition pressure is 0.4 Pa; the power of 13.56-MHz RF power source is 1.5 kW; the substrate temperature is 100° C.; and the distance between the substrate and the target is 60 mm. Next, the insulating film 104b which contains gallium oxide and has a thickness of 100 nm is formed by a sputtering method under the following conditions: gallium oxide is used as a target; the flow rate of oxygen is 50 sccm; the deposition pressure is 0.4 Pa; the power of 13.56-MHz RF power source is 1 kW; the substrate temperature is 350° C.; and the distance between the substrate and the target is 60 mm. Next, the protective film 104c which contains silicon oxide and has a thickness of 10 nm is formed by a sputtering method under the following conditions: silicon oxide is used as a target; the flow rate of oxygen is 50 sccm; the deposition pressure is 0.4 Pa; the power of 13.56-MHz RF power source is 1.5 kW; the substrate temperature is 100° C.; and the distance between the substrate and the target is 60 mm. By the above method, the gate insulating film 104 can be formed.

Further, the protective film 104a and the protective film 104c each preferably have a thickness greater than or equal to 5 nm, further preferably greater than or equal to 10 nm so that oxygen can be prevented from being extracted from the insulating film 104b by the conductive film 103a, the conductive film 103b, or the conductive film 105 which is to be formed later. Furthermore, the insulating film 104b preferably has a thickness greater than or equal to 5 nm, further preferably greater than or equal to 10 nm in order to obtain favorable withstand voltage of the gate insulating film 104. The thicknesses of the protective film 104a, the insulating film 104b, and the protective film 104c are determined so that the thickness of the gate insulating film 104 is greater than or equal to 15 nm and less than or equal to 500 nm, preferably greater than or equal to 30 nm and less than or equal to 300 nm.

Next, second heat treatment is preferably performed. The second heat treatment can be performed in a similar condition to the first heat treatment. By the second heat treatment, impurities such as hydrogen and water can be further removed from the semiconductor film 102. Further, hydrogen, moisture, or the like can be removed from the gate insulating film 104, so that the gate insulating film 104 can be made dense. Note that the second heat treatment may be performed at a timing which is after the conductive films 103a and 103b are formed and before the gate insulating film 104 is formed.

Next, a conductive film is formed over the gate insulating film 104 by a sputtering method or the like and then processed into a desired shape by etching or the like to form the conductive film 105 serving as a gate electrode. Aluminum, titanium, chromium, cobalt, nickel, copper, yttrium, zirconium, molybdenum, ruthenium, silver, tantalum, and tungsten, or an alloy material containing any of these as its main component can be used for the conductive film 105.

Figure 2D:
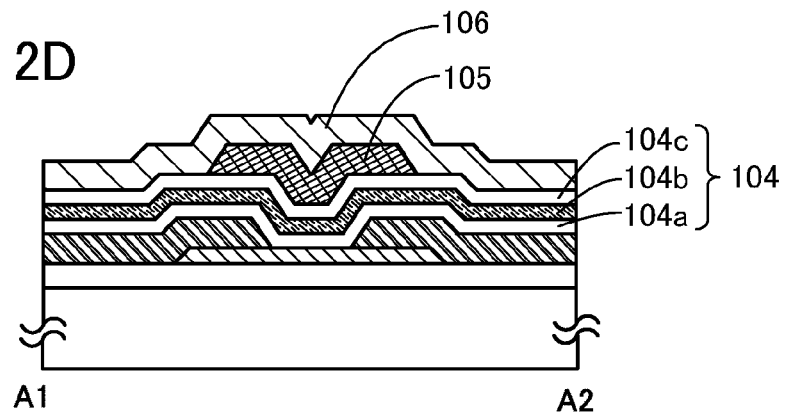

Next, the insulating film 106 is formed over the gate insulating film 104 and the conductive film 105 (see FIG. 2D). It is preferable that a material to which little oxygen is diffused or transferred be used for the insulating film 106. Further, a material containing little hydrogen is preferably used for the insulating film 106. The hydrogen content of the insulating film 106 is preferably lower than $5\times10^{19}$ cm$^{-3}$, further preferably lower than $5\times10^{18}$ cm$^{-3}$. When the hydrogen content of the insulating film 106 has the above value, off-state current of the transistor 100 can be low.

For example, a silicon nitride film or a silicon nitride oxide film is used as the insulating film 106. The insulating film 106 can be formed by a sputtering method, a CVD method, an MBE method, an ALD method, or a PLD method. In particular, for the insulating film 106, a silicon nitride film is preferably formed by a sputtering method, in which case the content of water or hydrogen is low.

Through the above-described process, the transistor 100 illustrated in FIGS. 1A to 1C can be fabricated.

<Structure of Semiconductor Film>

Next, an example of a structure of the semiconductor film 102 will be described in detail.

The semiconductor film 102 is not limited to a single oxide semiconductor film and may have a structure including a plurality of oxide semiconductor films which are stacked. An example of a structure of the transistor 100 in the case where the semiconductor film 102 includes an oxide semiconductor film 102a, an oxide semiconductor film 102b, and an oxide semiconductor film 102c is illustrated in FIGS. 3A to 3C.

Figure 3A:
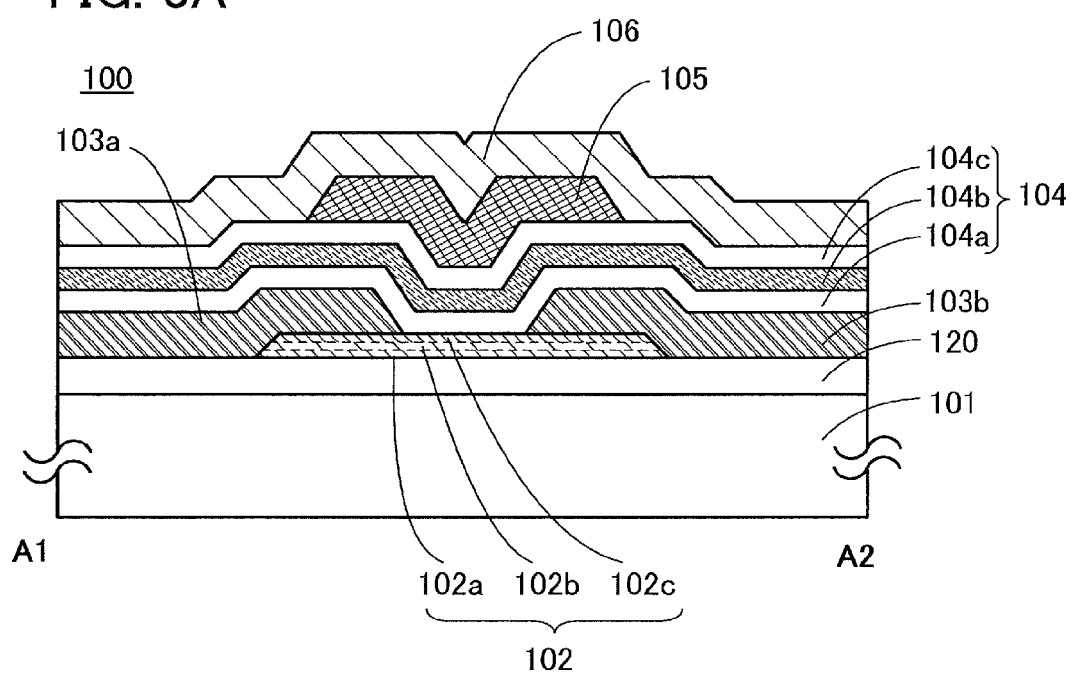
FIGS. 3A to 3C are cross-sectional views illustrating embodiments of a semiconductor device.
Figure 3B:
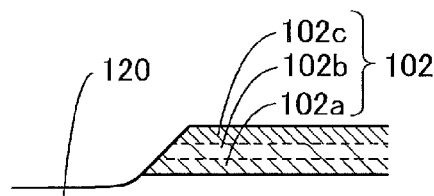
Figure 3C:
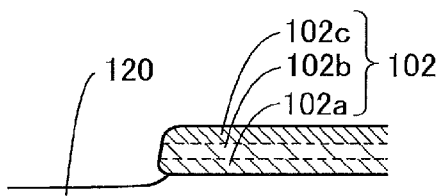

In the transistor 100 illustrated in FIG. 3A, the oxide semiconductor films 102a to 102c are stacked in this order from the insulating film 120 side.

The oxide semiconductor films 102a and 102c are each an oxide film which contains at least one of metal elements contained in the oxide semiconductor film 102b and whose bottom of the conduction band is closer to a vacuum level than that of the oxide semiconductor film 102b by 0.05 eV or more, 0.07 eV or more, 0.1 eV or more, or 0.15 eV or more and 2 eV or less, 1 eV or less, 0.5 eV or less, or 0.4 eV or less in an energy between the vacuum level and the bottom of the conduction band. Further, the oxide semiconductor film 102b preferably contains at least indium in order that the carrier mobility is high.

In the transistor 100 having the above structure, when a voltage is applied to the conductive film 105 serving as a gate electrode and an electric field is applied to the semiconductor film 102, a channel region is formed in the oxide semiconductor film 102b of the semiconductor film 102, whose energy of the bottom of the conduction band is lowest. That is, since the oxide semiconductor film 102c is provided between the oxide semiconductor film 102b and the gate insulating film 104, a channel region can be formed in the oxide semiconductor film 102b, which is separated from the gate insulating film 104.

Since the oxide semiconductor film 102c contains at least one of metal elements contained in the oxide semiconductor film 102b, interface scattering is unlikely to occur at the interface between the oxide semiconductor film 102b and the oxide semiconductor film 102c. Thus, carriers are not easily inhibited from moving at the interface, which results in an increase in the field-effect mobility of the transistor 100.

Further, when an interface level is formed at an interface between the oxide semiconductor film 102b and the oxide semiconductor film 102a, a channel region is formed also in a region in the vicinity of the interface, which causes a change in the threshold voltage of the transistor 100. However, since the oxide semiconductor film 102a contains at least one of metal elements contained in the oxide semiconductor film 102b, an interface level is unlikely to be formed at the interface between the oxide semiconductor film 102b and the oxide semiconductor film 102a. Accordingly, with the above structure, fluctuation in electrical characteristics of the transistor 100, such as a threshold voltage, can be reduced.

Further, it is preferable that a plurality of oxide semiconductor films be stacked so that an interface level due to an impurity existing between the oxide semiconductor films, which inhibits carrier flow, is not formed at an interface between the oxide semiconductor films. This is because when an impurity exists between the stacked oxide semiconductor films the continuity of the energies of the bottoms of the conduction bands of the oxide semiconductor films is lost, and carriers are trapped or disappear by recombination in the vicinity of the interface. By reducing an impurity existing between the films, a continuous junction (here, in particular, a well structure having a U shape in which energies of the bottoms of the conduction bands are changed continuously between the films) is formed easily as compared with the case of merely stacking the plurality of oxide semiconductor films which contain at least one common metal as a main component.

In order to form a continuous junction, the films needs to be stacked successively without exposure to the air with the use of a multi-chamber deposition apparatus (sputtering apparatus) including a load lock chamber. Each chamber in the sputtering apparatus is preferably subjected to high vacuum evacuation (to a vacuum of about $1\times10^{-4}$ Pa to $5\times10^{-7}$ Pa) with use of a suction vacuum evacuation pump such as a cryopump in order to remove water or the like which is an impurity for an oxide semiconductor as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible.

The oxide semiconductor film 102a or 102c may be, for example, an oxide film containing aluminum, silicon, titanium, gallium, germanium, yttrium, zirconium, tin, lanthanum, cerium, or hafnium at a higher atomic ratio than the oxide semiconductor film 102b. Specifically, the amount of any of the above elements in the oxide semiconductor film 102a or 102c in an atomic ratio is 1.5 times or more, preferably 2 times or more, further preferably 3 times or more as much as that in the oxide semiconductor film 102b in an atomic ratio. Any of the above elements is strongly bonded to oxygen and thus has a function of suppressing generation of an oxygen vacancy. Accordingly, with the above structure, an oxygen vacancy is more unlikely to be generated in the oxide semiconductor film 102a or 102c than in the oxide semiconductor film 102b.

Specifically, when both the oxide semiconductor film 102b and the oxide semiconductor film 102a or 102c are In-M-Zn-based oxide films, and the oxide semiconductor film 102a or 102c has an atomic ratio of In to M and Zn of $x_1:y_1:z_1$, and the oxide semiconductor film 102b has an atomic ratio of In to M and Zn which is $x_2:y_2:z_2$, the atomic ratio may be determined so that $y_1/x_1$ is larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the atomic ratio is determined so that $y_1/x_1$ is 1.5 times or more as large as $y_2/x_2$. Further preferably, the atomic ratio is determined so that $y_1/x_1$ is 2 times or more as large as $y_2/x_2$. Still further preferably, the atomic ratio is determined so that $y_1/x_1$ is 3 times or more as large as $y_2/x_2$. Here, in the oxide semiconductor film 102b, $y_1$ is preferably larger than or equal to $x_1$ because the transistor 100 can have stable electrical characteristics. However, when $y_1$ is 3 times or more as large as $x_1$, the field-effect mobility of the transistor 100 is reduced; accordingly, $y_1$ is preferably smaller than three times $x_1$.

The thickness of each of the oxide semiconductor films 102a and 102c is greater than or equal to 3 nm and less than or equal to 100 nm, preferably greater than or equal to 3 nm and less than or equal to 50 nm. The thickness of the oxide semiconductor film 102b is greater than or equal to 3 nm and less than or equal to 200 nm, preferably greater than or equal to 3 nm and less than or equal to 100 nm, further preferably greater than or equal to 3 nm and less than or equal to 50 nm.

In the semiconductor film 102 having a three-layer structure, the oxide semiconductor films 102a to 102c can be amorphous or crystalline. However, when the oxide semiconductor film 102b where a channel region is formed is crystalline, the transistor 100 can have stable electrical characteristics; therefore, the oxide semiconductor film 102b is preferably crystalline.

Note that a channel formation region refers to a region of a semiconductor film of a transistor, which overlaps with a gate electrode and which is between a source electrode and a drain electrode. Further, a channel region refers to a region through which current mainly flows in the channel formation region.

For example, in the case of using an In—Ga—Zn-based oxide film formed by a sputtering method as each of the oxide semiconductor films 102a and 102c, for film formation of the oxide semiconductor films 102a and 102c, a sputtering target which is In—Ga—Zn-based oxide containing In, Ga, and Zn at an atomic ratio of 1:3:2 can be used. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, in the case where the oxide semiconductor film 102b is a CAAC-OS film, for film formation of the oxide semiconductor film 102b, a sputtering target which is a polycrystalline In—Ga—Zn-based oxide containing In, Ga, and Zn at an atomic ratio of 1:1:1 is preferably used. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that FIG. 3A illustrates a structure in which the semiconductor film 102 is provided over the insulating film 120 with a flat surface. However, in one embodiment of the present invention, as illustrated in FIG. 3B, part of the insulating film 120 may be also etched when the semiconductor film 102 is formed by etching. In this case, the insulating film 120 has a projection in a region positioned below the semiconductor film 102.

In addition, FIG. 3A illustrates a structure in which end portions of the semiconductor film 102 are inclined. However, in one embodiment of the present invention, as illustrated in FIG. 3C, the end portion of the semiconductor film 102 may be rounded.

Note that although FIGS. 3B and 3C each illustrate the semiconductor film 102 having a stacked-layer structure as an example, the structure of the insulating film 120 which is illustrated in FIG. 3B and the structure of the end portion of the semiconductor film 102 which is illustrated in FIG. 3C can also be applied to the case where the semiconductor film 102 has a single-layer structure.

Structural Example 2 of Transistor

Next, a structural example of the transistor 100 having, in addition to the structure illustrated in FIGS. 1A to 1C, a conductive film which serves as a gate electrode and is provided in a position opposed to the conductive film 105 with the semiconductor film 102 interposed therebetween will be described with reference to FIGS. 4A to 4C.

Figure 4A:
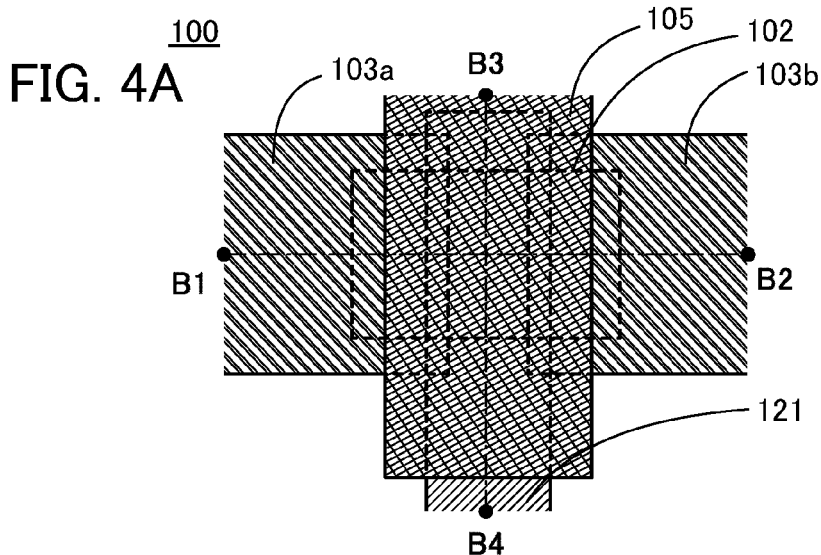
FIGS. 4A to 4C are a plan view and cross-sectional views illustrating a structure of a transistor.

FIG. 4A is a top view of the transistor 100. FIG. 4B and FIG. 4C are cross-sectional views of the transistor 100 illustrated in FIG. 4A, which are taken along chain line B1-B2 and chain line B3-B4, respectively. Note that various insulating films including a gate insulating film are omitted in the top view of FIG. 4A for a simple layout of the transistor 100.

Figure 4B:
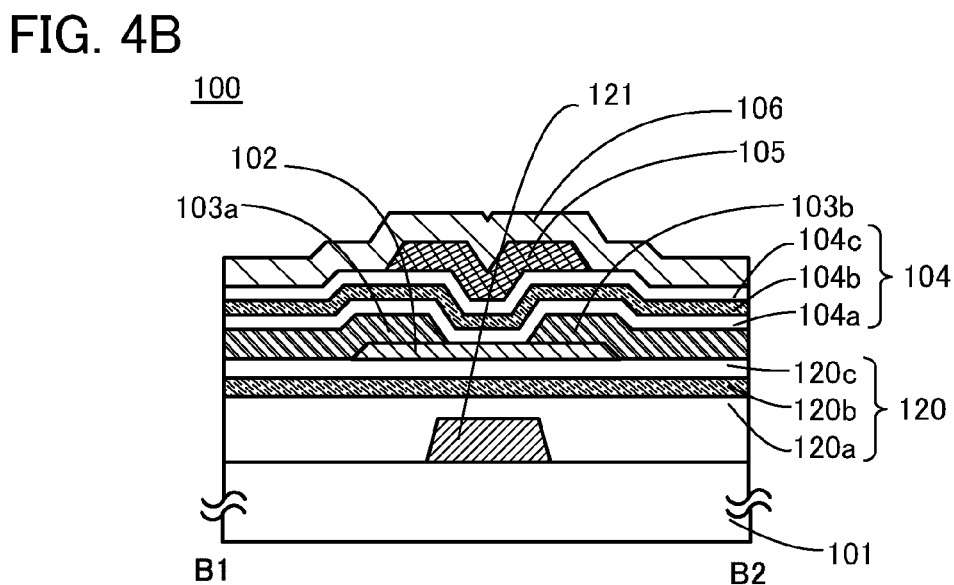
Figure 4C:
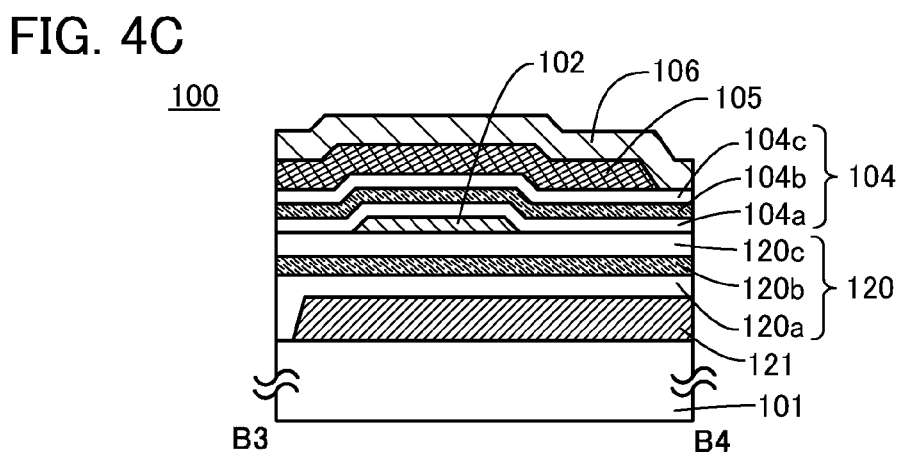

In the transistor 100 illustrated in FIGS. 4A to 4C, a conductive film 121 serving as a gate electrode is provided between the substrate 101 and the insulating film 120. Further, the conductive film 121 overlaps with the conductive film 105 with the insulating film 120, the semiconductor film 102, and the gate insulating film 104 interposed therebetween. Note that although FIGS. 4A to 4C illustrate a case where the conductive film 121 is provided over and in contact with the substrate 101 as an example, an insulating film may be provided between the substrate 101 and the conductive film 121.

Further, FIGS. 4A to 4C illustrate, as an example, a case where the insulating film 120 includes a protective film 120a, an insulating film 120b containing a metal oxide, and a protective film 120c, which are stacked in this order. That is, the insulating film 120 has a structure in which the insulating film 120b is interposed between the protective film 120a and the protective film 120c. Therefore, in the transistor 100, the protective film 120a exists between the insulating film 120b and the conductive film 121, and thus the insulating film 120b is not in contact with the conductive film 121. Further, in the transistor 100, the protective film 120c exists between the insulating film 120b and the conductive films 103a and 103b, and thus the insulating film 120b is not in contact with the conductive film 103a and the conductive film 103b.

The insulating film 120b is formed using a metal oxide which can keep a sufficiently high withstand voltage even when a small amount of a metal such as indium in the semiconductor film 102 enters the metal oxide. As the metal oxide, for example, gallium oxide, zirconium oxide, hafnium oxide, or the like is preferably used. Further, an oxide containing zinc in addition to gallium, zirconium, or hafnium, such as a Ga—Zn-based oxide, may be used. The use of the insulating film 120b described above for the insulating film 120 prevents the withstand voltage of the insulating film 120b from being lowered even when a metal such as indium enters the insulating film 120b through the protective film 120a or the protective film 120c.

Further, as each of the protective film 120a and the protective film 120c, an insulating film which can prevent oxygen in the insulating film 120b from being extracted by the conductive film 103a, the conductive film 103b, or the conductive film 121 is used. For example, as each of the protective film 120a and the protective film 120c, an insulating film containing silicon oxide, silicon nitride, silicon oxynitride, silicon nitride oxide, aluminum oxide, aluminum oxynitride, or the like can be used.

In the insulating film 120b containing a metal oxide, when the oxygen content is reduced, the number of oxygen vacancies is increased, and thus the number of donors generated owing to the oxygen vacancies is also increased, and the withstand voltage of the insulating film 120b is easily lowered. However, in one embodiment of the present invention, the protective film 120a is provided between the insulating film 120b and the conductive film 121, and the protective film 120c is provided between the insulating film 120b and the conductive films 103a and 103b, whereby oxygen in the insulating film 120b can be prevented from being extracted, and the withstand voltage of the insulating film 120b can be prevented from being lowered.

Accordingly, in one embodiment of the present invention, the insulating film 120 includes at least the protective film 120a, the insulating film 120b, and the protective film 120c, which are stacked in this order; thus, the transistor 100 can have higher withstand voltage than a transistor in which a gate insulating film includes only an insulating film whose withstand voltage is lowered owing to entry of indium, such as an silicon oxide film.

Note that the insulating film 120 does not need to have the above structure and may be a single layer of an insulating film containing silicon oxide, silicon nitride, silicon oxynitride, silicon nitride oxide, aluminum oxide, aluminum oxynitride, or the like.

Structural Example 3 of Transistor

Next, another structural example of a transistor included in a semiconductor device of one embodiment of the present invention will be described with reference to FIGS. 5A to 5C.

Figure 5A:
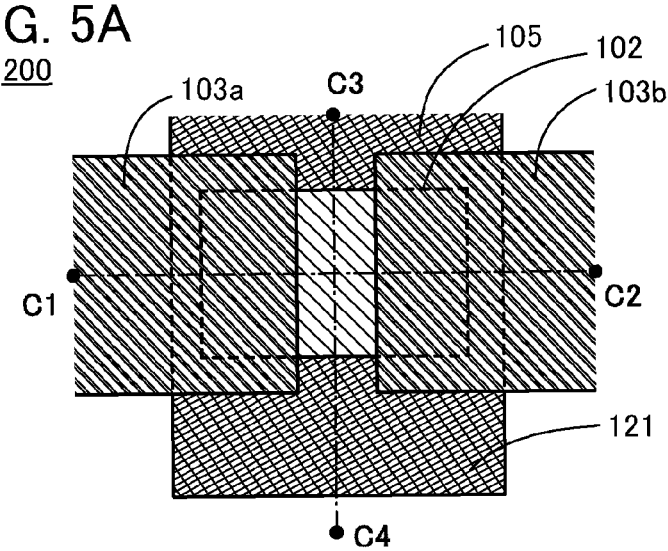
FIGS. 5A to 5C are a plan view and cross-sectional views illustrating one embodiment of a semiconductor device.

FIG. 5A is a top view of a transistor 200. FIG. 5B and FIG. 5C are cross-sectional views of the transistor 200 illustrated in FIG. 5A, which are taken along chain line C1-C2 and chain line C3-C4, respectively. Note that various insulating films including a gate insulating film are omitted in the top view of FIG. 5A for a simple layout of the transistor 200.

Figure 5B:
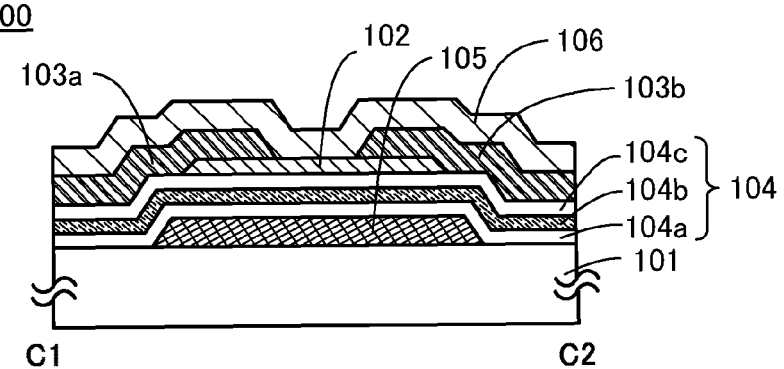
Figure 5C:
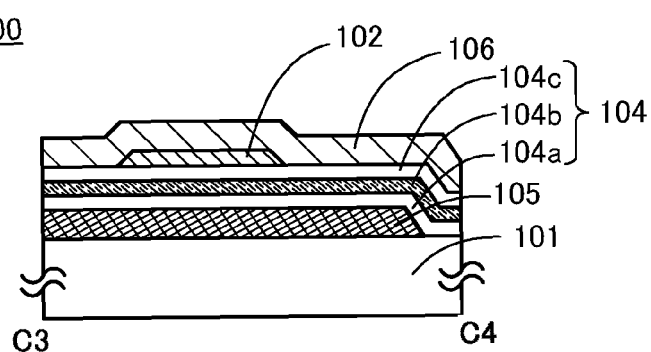

The transistor 200 illustrated in FIGS. 5A to 5C includes, over the substrate 101, the conductive film 105 serving as a gate electrode; the gate insulating film 104 over the conductive film 105; the semiconductor film 102 which is positioned over the gate insulating film 104 so as to overlap with the conductive film 105 and includes an oxide semiconductor; and the conductive film 103a and the conductive film 103b which are positioned over and in contact with the semiconductor film 102, one of which serves as a source electrode, the other of which serves as a drain electrode.

FIGS. 5B and 5C illustrate a structure in which the insulating film 106 is provided over the transistor 200 as an example. The insulating film 106 may be included in the transistor 200.

Although FIGS. 5A to 5C illustrate a case where the conductive film 105 is provided over and in contact with the substrate 101 as an example, an insulating film may be provided between the substrate 101 and the conductive film 105.

Further, also in the transistor 200 illustrated in FIGS. 5A to 5C, the gate insulating film 104 includes at least the protective film 104a, the insulating film 104b containing a metal oxide, and the protective film 104c, which are stacked in this order, as in the transistor 100 illustrated in FIGS. 1A to 1C. In the transistor 200 illustrated in FIGS. 5A to 5C, the protective film 104a exists between the insulating film 104b and the conductive film 105, and thus the insulating film 104b is not in contact with the conductive film 105. Further, in the transistor 200, the protective film 104c exists between the insulating film 104b and the conductive films 103a and 103b, and thus the insulating film 104b is not in contact with the conductive film 103a and the conductive film 103b.

In one embodiment of the present invention, the gate insulating film 104 includes at least the protective film 104a, the insulating film 104b, and the protective film 104c, which are stacked in this order; thus, the transistor 200 can have higher withstand voltage than a transistor in which a gate insulating film includes only an insulating film whose withstand voltage is lowered owing to entry of indium, such as an silicon oxide film.

Further, gallium oxide, zirconium oxide, and hafnium oxide each have a higher dielectric constant than silicon oxide, and thus can prevent an increase in current (leakage current) flowing between the gate electrode and the semiconductor film through the gate insulating film due to miniaturization of the transistor 200. In particular, zirconium oxide and hafnium oxide each have an extremely higher dielectric constant than silicon oxide; therefore, an increase in leakage current due to miniaturization can be suppressed more effectively in a transistor in which a gate insulating film includes a zirconium oxide film or a hafnium oxide film than in a transistor in which a gate insulating film includes only a silicon oxide film.

Embodiment 2

In this embodiment, a structural example of a semiconductor display device, which is one of semiconductor devices of the present invention, will be described.

Figure 6A:
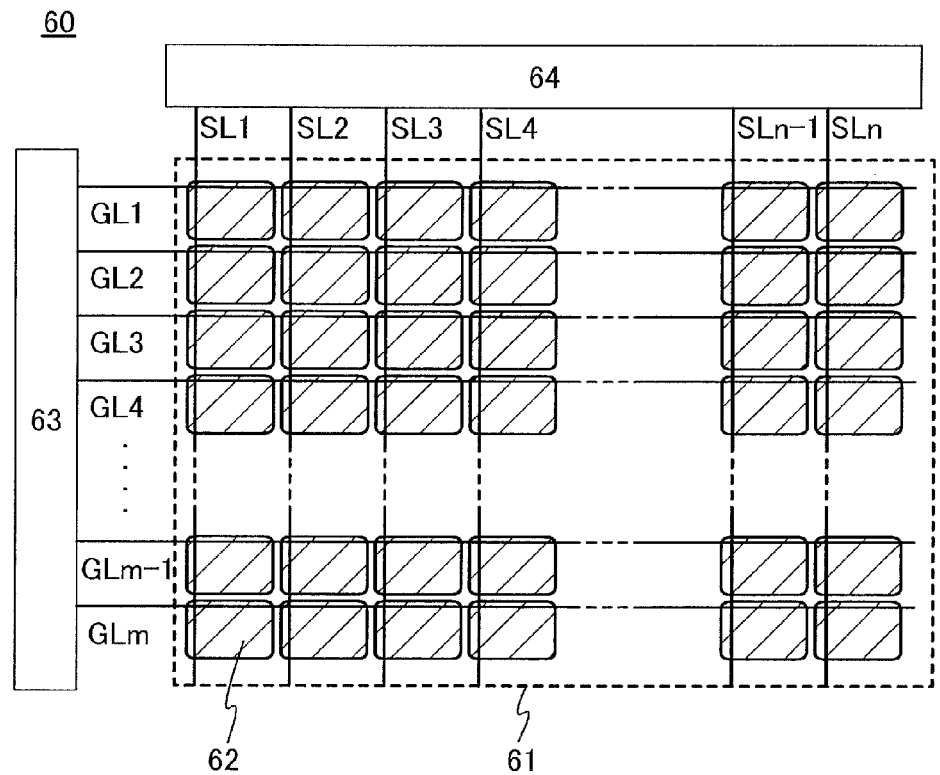
FIGS. 6A to 6C are diagrams illustrating a structure of a semiconductor display device.

In a pixel portion 61 of a panel 60 illustrated in FIG. 6A, a plurality of pixels 62, scan lines GL which are denoted by scan lines GL1 to GLm (m is a natural number) and used for selecting the pixels 62 row by row, and signal lines SL which are denoted by signal lines SL1 to SLn (n is a natural number) and supply image signals to the selected pixels 62 are provided. The input of signals to the scan lines GL is controlled by a scan line driver circuit 63. The input of image signals to the signal lines SL is controlled by a signal line driver circuit 64. Each of the plurality of pixels 62 is connected to at least one of the scan lines GL and at least one of the signal lines SL.

Note that the kinds and number of wirings provided in the pixel portion 61 depend on the configuration, number, and arrangement of the pixels 62. Specifically, in the pixel portion 61 illustrated in FIG. 6A, the pixels 62 are arranged in a matrix of n rows and m columns, and the signal lines SL1 to SLn and the scan lines GL1 to GLm are provided in the pixel portion 61.

Figure 6B:
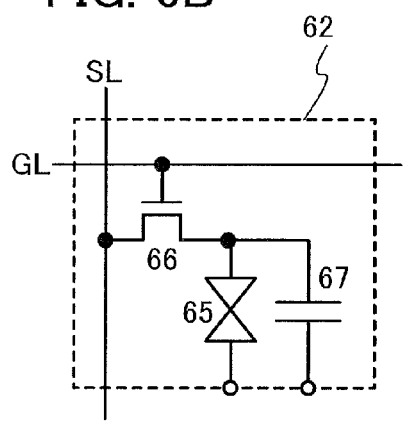

FIG. 6B illustrates an example of the configuration of the pixel 62. The pixel 62 includes a liquid crystal element 65, a transistor 66 for controlling supply of an image signal to the liquid crystal element 65, and a capacitor 67 for holding a voltage between a pixel electrode and a common electrode of the liquid crystal element 65. The liquid crystal element 65 includes the pixel electrode, the common electrode, and a liquid crystal layer containing a liquid crystal material to which voltage between the pixel electrode and the common electrode is applied.

The transistor 66 controls whether to supply the potential of the signal line SL to the pixel electrode of the liquid crystal element 65. A predetermined potential is applied to the common electrode of the liquid crystal element 65.

The connection relation between the transistor 66 and the liquid crystal element 65 will be specifically described below. In FIG. 6B, a gate electrode of the transistor 66 is connected to one of the scan lines GL1 to GLm. One of a source electrode and a drain electrode of the transistor 66 is connected to one of the signal lines SL1 to SLn, and the other thereof is connected to the pixel electrode of the liquid crystal element 65.

Note that the term "connection" in this specification refers to electrical connection and corresponds to the state in which current, a potential, or voltage can be supplied or transmitted. Therefore, a state of electrical connection means not only a state of direct connection but also a state of electrical connection through an element such as a resistor, a diode, or a transistor, in which current, voltage, or a potential can be supplied or transmitted.

In the example illustrated in FIG. 6B, in the pixel 62, one transistor 66 is used as a switch for controlling the input of an image signal to the pixel 62. However, a plurality of transistors functioning as one switch may be used in the pixel 62.

In one embodiment of the present invention, the transistor 100 described in Embodiment 1 is used as the transistor 66, whereby the semiconductor display device can have higher reliability. Further, since the transistor 100 has an extremely low off-state current, use of the transistor 100 as the transistor 66 can prevent leakage of electric charge through the transistor 66. Therefore, the potential of an image signal supplied to the liquid crystal element 65 and the capacitor 67 can be held more surely, and thus a change in the transmittance of the liquid crystal element 65 in one frame period due to leakage of electric charge can be prevented. As a result, the quality of a displayed image can be improved. Further, since electric charge can be prevented from leaking through the transistor 66 when the off-state current of the transistor 66 is small, the area of the capacitor 67 can be made small. Accordingly, the transmittance of the panel 60 can be improved, and thus the loss of light supplied from a light supply portion such as a backlight or a frontlight in the panel 60 can be reduced. As a result, the power consumption of a liquid crystal display device can be reduced. In a period in which a still image is displayed, the supply of a power supply potential or a signal to the scan line driver circuit 63 and the signal line driver circuit 64 may be stopped. With the above configuration, the number of times of writings image signals to the pixel portion 61 can be reduced, and thus power consumption of the semiconductor display device can be reduced.

Figure 6C:
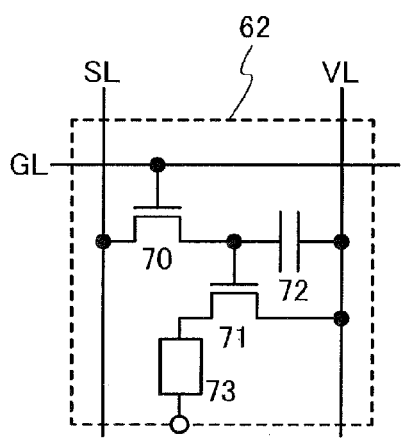

Next, FIG. 6C illustrates another example of the pixel 62. The pixel 62 includes a transistor 70 controlling input of an image signal to the pixel 62, a light-emitting element 73, a transistor 71 controlling the value of current supplied to the light-emitting element 73 in response to an image signal, and a capacitor 72 for holding the potential of an image signal.

The potential of one of an anode and a cathode of the light-emitting element 73 is controlled in response to an image signal input to the pixel 62. A predetermined potential is applied to the other of the anode and the cathode of the light-emitting element 73. The luminance of the light-emitting element 73 is determined by a potential difference between the anode and the cathode. In each of the plurality of pixels 62 included in the pixel portion, the luminance of the light-emitting element 73 is adjusted in response to an image signal containing image information, so that an image is displayed on the pixel portion 61.

Next, connection between the transistor 70, the transistor 71, the capacitor 72, and the light-emitting element 73 which are included in the pixel 62 is described.

One of a source electrode and a drain electrode of the transistor 70 is connected to a signal line SL, and the other of the source electrode and the drain electrode of the transistor 70 is connected to a gate electrode of the transistor 71. A gate electrode of the transistor 70 is connected to the scan line GL. One of a source electrode and a drain electrode of the transistor 71 is connected to a power supply line VL, and the other of the source electrode and the drain electrode of the transistor 71 is connected to the light-emitting element 73. Specifically, the other of the source electrode and the drain electrode of the transistor 71 is connected to one of the anode and the cathode of the light-emitting element 73. The predetermined potential is applied to the other of the anode and the cathode of the light-emitting element 73.

Note that the pixel 62 illustrated in FIG. 6C includes the capacitor 72. However, for example, in the case where the gate capacitance formed between a gate electrode and a semiconductor film of the transistor 70 or the parasitic capacitance of the gate electrode is sufficiently high, i.e., the case where a potential of an image signal can be sufficiently held by another capacitor, the capacitor 72 is not necessarily provided in the pixel 62.

Examples of the light-emitting element 73 include an element whose luminance is controlled by current or voltage, such as a light-emitting diode (LED) or an organic light-emitting diode (OLED). For example, an OLED includes at least an EL layer, an anode, and a cathode. The EL layer is formed using a single layer or a plurality of layers provided between the anode and the cathode, at least one of which is a light-emitting layer containing a light-emitting substance.

From the EL layer, electroluminescence is obtained by current supplied when a potential difference between the cathode and the anode is higher than or equal to the threshold voltage of the light-emitting element 73. As electroluminescence, there are luminescence (fluorescence) at the time of returning from a singlet-excited state to a ground state and luminescence (phosphorescence) at the time of returning from a triplet-excited state to a ground state.

This embodiment can be implemented combining with any of the other embodiments as appropriate.

Embodiment 3

Diffusion of Indium into Silicon Oxynitride Film

A 300-nm-thick silicon oxide film, a 100-nm-thick oxide semiconductor film containing indium, and a 100-nm-thick silicon oxynitride film were formed over a silicon substrate in this order. The silicon oxynitride film and the oxide semiconductor film containing indium were analyzed by secondary ion mass spectrometry (SIMS). Note that the oxide semiconductor film containing indium was formed by a sputtering method using a target containing In, Ga, and Zn at an atomic ratio of 1:1:1 at a substrate temperature of 200° C. The silicon oxynitride film was formed by a plasma CVD method under the following conditions: the substrate temperature was 400° C., the flow rate of $SiH_4$ was 1 sccm, and the flow rate of $N_2O$ was 800 sccm.

Figure 10:
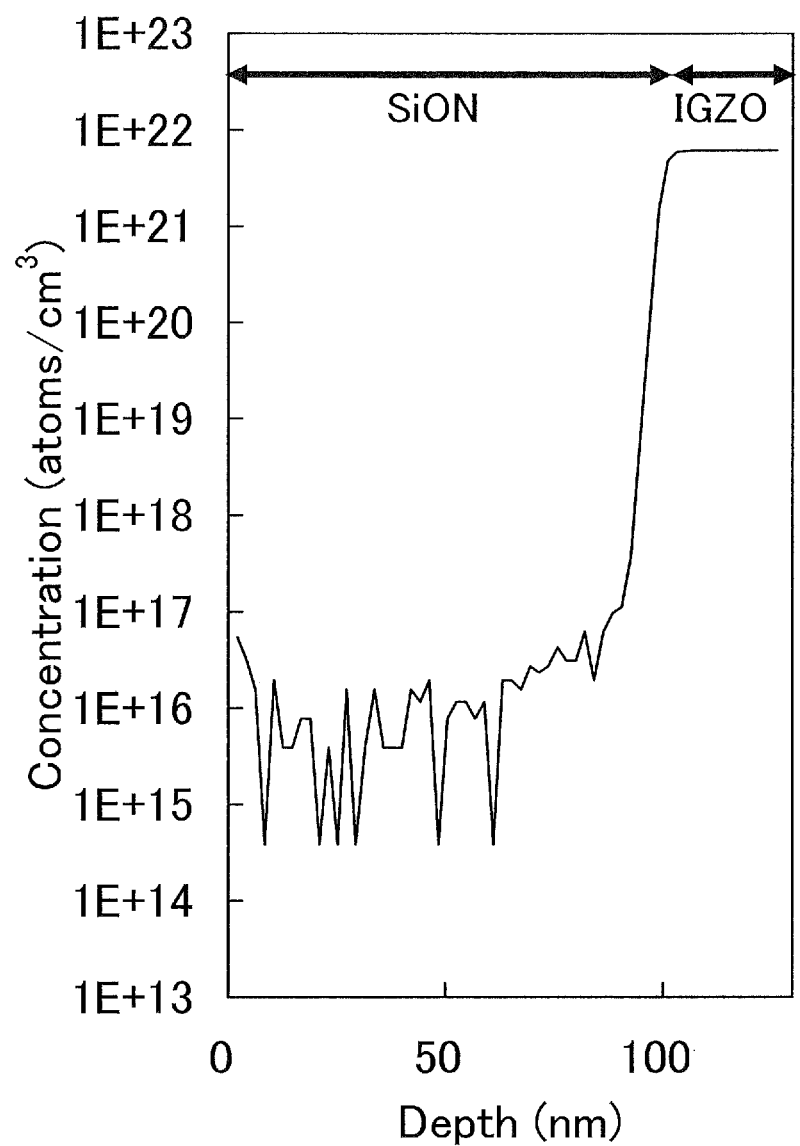
FIG. 10 shows a result of SIMS analysis.

FIG. 10 shows an indium concentration profile measured by SIMS analysis. In FIG. 10, an arrow denoted by SiON means a range in a depth direction where the silicon oxynitride film exists, and an arrow denoted by IGZO means a range in a depth direction where the oxide semiconductor film containing indium exists.

As shown in FIG. 10, indium is diffused into a region of the silicon oxynitride film, whose range is approximately 40 nm from an interface between the oxide semiconductor film containing indium and the silicon oxynitride film. The indium concentration is within the range of $1.0 \times 10^{15}$ atoms/cm$^3$ to $1.0 \times 10^{18}$/atoms/cm$^3$. It is found from FIG. 10 that indium contained in the oxide semiconductor film is diffused into the silicon oxynitride film. This means that in the case of forming a transistor in such a manner that an oxide semiconductor film containing indium is provided and an insulating film containing silicon is provided over the oxide semiconductor film as a gate insulating film, indium is diffused into the gate insulating film as described above.

Embodiment 4

Structure of Liquid Crystal Display Device

Figure 7A:
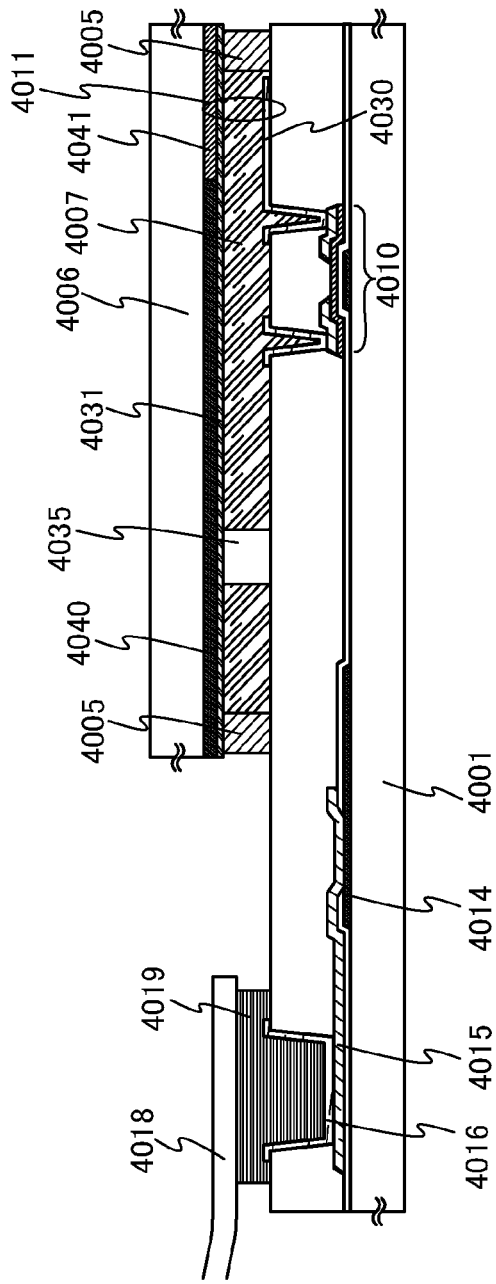
FIGS. 7A and 7B are cross-sectional views each illustrating a structure of a semiconductor display device.

Next, a structure of a liquid crystal display device which is one of semiconductor devices of one embodiment of the present invention will be described with reference to FIG. 7A. FIG. 7A is a cross-sectional view of the liquid crystal display device in which a substrate 4001 and a substrate 4006 are attached to each other with a sealant 4005.

In FIG. 7A, a liquid crystal layer 4007 is sealed in a region surrounded by the sealant 4005 between the substrate 4001 and the substrate 4006. Further, in FIG. 7A, a transistor 4010 included in a pixel is illustrated. A pixel electrode 4030 included in a liquid crystal element 4011 is connected to the transistor 4010. A common electrode 4031 of the liquid crystal element 4011 is formed on the substrate 4006. The liquid crystal element 4011 corresponds to a region where the pixel electrode 4030, the common electrode 4031, and the liquid crystal layer 4007 overlap with each other.

Note that although the case where the common electrode 4031 is provided on the substrate 4006 is illustrated in FIG. 7A, in a liquid crystal display device of one embodiment of the present invention, the common electrode 4031 may be provided over the substrate 4001.

A blocking film 4040 formed on the substrate 4006 overlaps with a region where the transistor 4010 is formed. The substrate 4006 is provided with a coloring layer 4041 which serves as a color filter and through which only visible light in a particular wavelength region is preferentially transmitted, and the coloring layer 4041 overlaps with a region where the liquid crystal element 4011 is formed.

When the coloring layer 4041 through which light in a wavelength region corresponding to red, blue, or green is preferentially transmitted is provided in each pixel, a full color image can be displayed. In this case, it is preferable to use a backlight by which white light can be obtained so that color purity of an image is increased. As the backlight by which white light can be obtained, for example, a structure in which a red light source, a blue light source, and a green light source are combined; a structure in which a yellow or orange light source and a blue light source are combined; a structure in which only a white light source is used; a structure in which a cyan light source, a magenta light source, and a yellow light source are combined; or the like can be employed.

Alternatively, light in a wavelength region corresponding to red, blue, and green may be output sequentially from the backlight. In this case, a full color image can be displayed even when a color filter is not used, and luminous efficiency of the liquid crystal display device can be increased.

In addition to a cold-cathode tube, a light-emitting element such as an LED or an OLED can be used as a light source for a backlight. Note that because a wavelength of light to be obtained is different depending on a light source, a light source may be selected as appropriate in accordance with a required color.

Note that although FIG. 7A shows an example in which the blocking film 4040 and the coloring layer 4041 are provided on the substrate 4006 side, the blocking film 4040 or the coloring layer 4041 may be provided on the substrate 4001 side. The positions of the blocking film 4040 and the coloring layer 4041 can be set as appropriate in accordance with a direction of light incident on the liquid crystal element 4011 and an emission direction of light transmitted through the liquid crystal element 4011.

A spacer 4035 is provided in order to control the distance between the pixel electrode 4030 and the common electrode 4031 (a cell gap). FIG. 7A shows the case where the spacer 4035 is formed by patterning of an insulating film; alternatively, a spherical spacer may be used.

A variety of signals and potentials that are given to the pixels are supplied from a terminal 4016 through wirings 4014 and 4015. The terminal 4016 is electrically connected to a terminal included in a FPC 4018 through an anisotropic conductive film 4019.

Structure of Light-Emitting Device

Figure 7B:
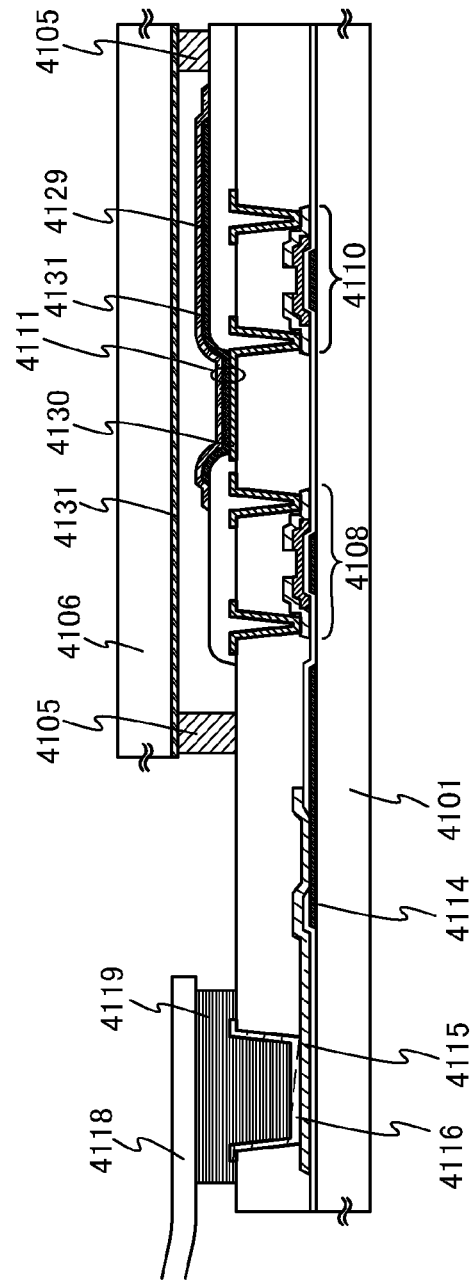

Next, a structure of a light-emitting device which is one of semiconductor devices of one embodiment of the present invention will be described with reference to FIG. 7B. FIG. 7B is a cross-sectional view of the light-emitting device in which a substrate 4101 and a substrate 4106 are attached to each other with a sealant 4105.

In FIG. 7B, a light-emitting element 4111 is sealed together with a filler in a region surrounded by the sealant 4105 between the substrate 4101 and the substrate 4106. The filler may be formed of an ultraviolet curable resin or a thermosetting resin as well as inert gas such as nitrogen or argon. For the sealant 4105, a resin (such as an ultraviolet curable resin or a thermosetting resin), glass frit, or the like can be used.

FIG. 7B illustrates a transistor 4108 and a transistor 4110 included in the pixel. A pixel electrode 4130 included in a light-emitting element 4111 is connected to the transistor 4110. A portion where the pixel electrode 4130, a common electrode 4131, and an EL layer 4129 overlap with each other corresponds to the light-emitting element 4111.

In a light-emitting device of one embodiment of the present invention, it is possible to employ a color filter method in which full-color images are displayed using a combination of a color filter including a coloring layer and a light-emitting element that emits light of a single color such as white. Alternatively, it is possible to employ a method in which full-color images are displayed by using a plurality of light-emitting elements which emit light of different hues. This method is referred to as separate coloring method because EL layers, which are each placed between a pair of electrodes in a light-emitting element, are separately colored with their corresponding colors.

In the separate coloring method, in general, EL layers are separately applied by vapor deposition with the use of a mask such as a metal mask. Thus, the size of pixels depends on the accuracy of separate coloring of the EL layers by vapor deposition. On the other hand, unlike the separate coloring method, EL layers do not need to be separately applied in the color filter method. Accordingly, pixels can be downsized more easily than in the separate coloring method; thus, a high-definition pixel portion can be realized.

In the top-emission structure, light emitted from a light-emitting element is not blocked by an element such as a wiring, a transistor, or a capacitor, so that the efficiency of light extraction from a pixel can be made higher than that in the bottom-emission structure. Accordingly, the top-emission structure can achieve high luminance even when the amount of current supplied to the light-emitting element is reduced, and therefore is advantageous in improving the lifetime of a light-emitting element.

The light-emitting device of one embodiment of the present invention may have a microcavity (micro optical resonator) structure in which light emitted from an EL layer resonates within a light-emitting element. With the microcavity structure, light having a specific wavelength can be extracted from the light-emitting element with high efficiency, so that the luminance and the color purity of the pixel portion can be improved.

A variety of signals and potentials that are given to the pixels are supplied from a terminal 4116 through wirings 4114 and 4115. The terminal 4116 is electrically connected to a terminal included in a FPC 4118 through an anisotropic conductive film 4119.

This embodiment can be implemented combining with any of the other embodiments as appropriate.

Embodiment 5

Figure 8:
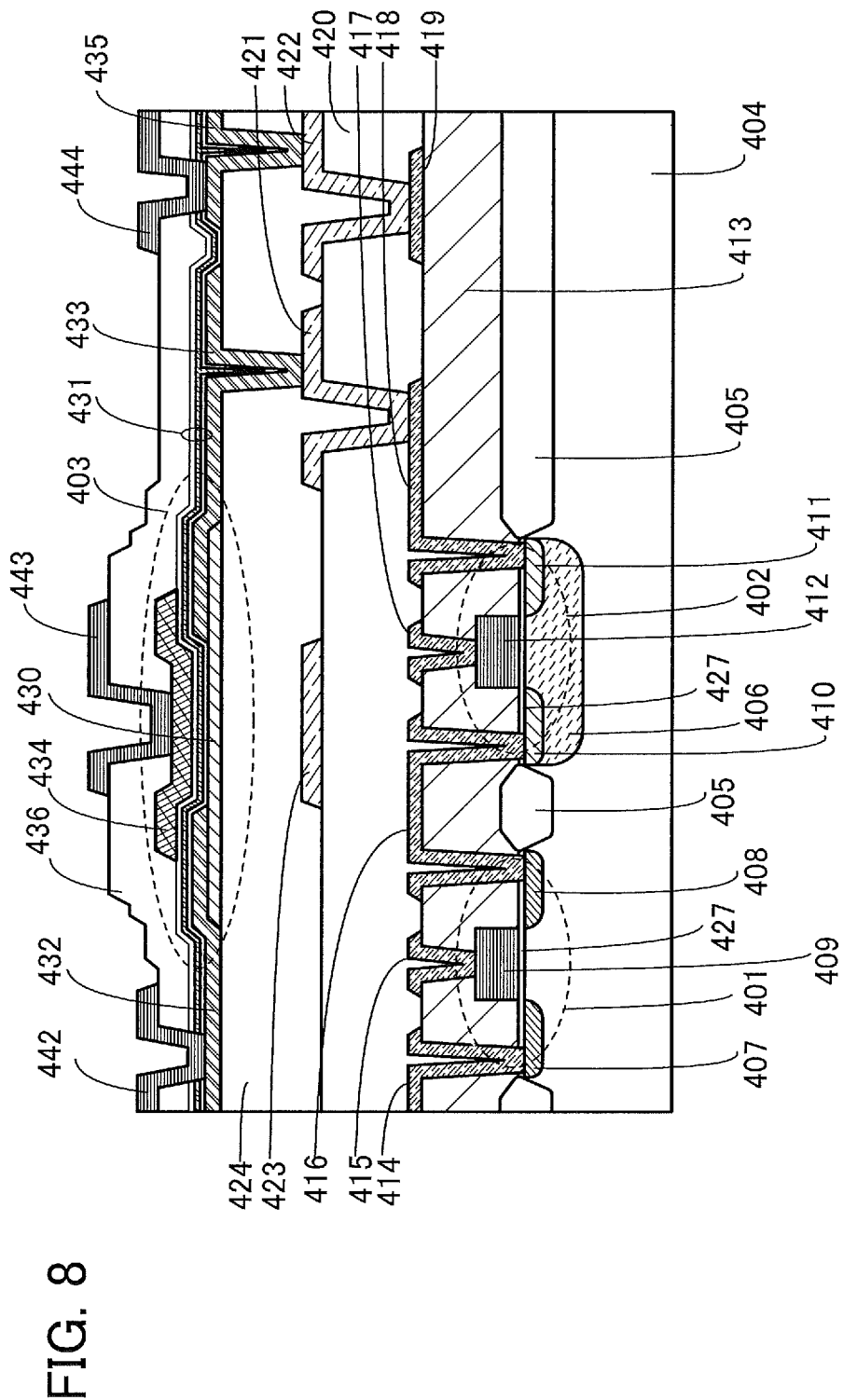
FIG. 8 is a cross-sectional view of a semiconductor device.

FIG. 8 illustrates an example of part of a cross-sectional structure of a semiconductor device of one embodiment of the present invention.

In this embodiment, described is the case where a p-channel transistor 401 and an n-channel transistor 402 are formed in a single crystal silicon substrate and the transistor 403 using an oxide semiconductor film is formed over the transistor 401 and the transistor 402. The transistors 401 and 402 may each include a semiconductor thin film of silicon, germanium, or the like in an amorphous, microcrystalline, polycrystalline, or signal crystal state. Alternatively, the transistors 401 and 402 may each include an oxide semiconductor film. In the case where the transistors each include an oxide semiconductor film, the transistor 403 is not necessarily stacked above the transistors 401 and 402, and the transistors 401, 402, and 403 may be formed over the same insulating surface.

In the case where the transistors 401 and 402 may each be formed using a thin silicon film, any of the following can be used: amorphous silicon formed by a sputtering method or a vapor phase growth method such as a plasma CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

In FIG. 8, a transistor 401 and a transistor 402 are formed on a semiconductor substrate 404.

The semiconductor substrate 404 can be, for example, an n-type or p-type single crystal silicon substrate or compound semiconductor substrate (e.g., GaAs substrate, InP substrate, GaN substrate, SiC substrate, or ZnSe substrate). In FIG. 8, a case where a single crystal silicon substrate having n-type conductivity is used is illustrated as an example.

The transistors 401 and 402 are electrically isolated from each other by an element isolation insulating film 405. The element isolation insulating film 405 can be formed by a local oxidation of silicon (LOCOS) method, a trench isolation method, or the like.

In a region where the transistor 402 is formed, a p-well 406 is formed by selective introduction of an impurity element imparting p-type conductivity.

Specifically, the transistor 401 includes the semiconductor substrate 404, impurity regions 407 and 408 that are formed in the semiconductor substrate 404 and function as a source region and a drain region, a gate electrode 409, and a gate insulating film 427 provided between the semiconductor substrate 404 and the gate electrode 409. The gate electrode 409 overlaps with a channel formation region formed between the impurity regions 407 and 408 with the gate insulating film 427 laid between the gate electrode 409 and the channel formation region.

Further, the transistor 402 includes the semiconductor substrate 404, impurity regions 410 and 411 that are formed in the semiconductor substrate 404 and function as a source region and a drain region, a gate electrode 412, and the gate insulating film 427 sandwiched between the semiconductor substrate 404 and the gate electrode 412. The gate electrode 412 overlaps with a channel formation region formed between the impurity regions 410 and 411 with the gate insulating film 427 laid between the gate electrode 412 and the channel formation region.

An insulating film 413 is formed over the transistors 401 and 402. Openings are formed in the insulating film 413. In the openings, a wiring 414, a wiring 415, a wiring 416, a wiring 417, and a wiring 418, which are in contact with the impurity region 407, the gate electrode 409, the impurity region 408 and the impurity region 410, the gate electrode 412, and the impurity region 411 are formed over the insulating film 413. Further, a wiring 419 is formed over the insulating film 413.

An insulating film 420 is formed over the wirings 414 to 419. In the insulating film 420, openings are formed. In the openings, a wiring 421 connected to the wiring 418 and a wiring 422 connected to the wiring 419 are formed over the insulating film 420. Further, a wiring 423 is formed over the insulating film 420.

An insulating film 424 is formed over the wirings 421 to 423.

Further, in FIG. 8, the transistor 403 is formed over the insulating film 424.

The transistor 403 includes, over the insulating film 424, a semiconductor film 430 including an oxide semiconductor; conductive films 432 and 433 that are provided over the semiconductor film 430 and function as source and drain electrodes; a gate insulating film 431 over the semiconductor film 430 and the conductive films 432 and 433; and a gate electrode 434 that overlaps the semiconductor film 430 in the region between the conductive films 432 and 433, with the gate insulating film 431 placed between the gate electrode 434 and the semiconductor film 430.

The gate insulating film 431 includes at least a protective film, an insulating film containing a metal oxide, and a protective film, which are stacked in this order, as in the transistor 100 illustrated in FIGS. 1A to 1C.

In the insulating film 424, openings are formed. In the openings, the conductive film 433 is in contact with the wiring 421, and a wiring 435, which is provided over the insulating film 424, is connected to the wiring 422.

In addition, an insulating film 436 is provided over the transistor 403 and the wiring 435. Openings are formed in the insulating film 436 and the gate insulating film 431. In the openings, a wiring 442 in contact with the conductive film 432, a wiring 443 in contact with the gate electrode 434, and a wiring 444 in contact with the wiring 435 are provided over the insulating film 436.

Note that in the transistor 403 in FIG. 8, the wiring 423 can serve as a gate electrode.

This embodiment can be implemented combining with any of the other embodiments as appropriate.

Embodiment 6

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other than the above, as an electronic device which can use the semiconductor device of one embodiment of the present invention, mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are illustrated in FIGS. 9A to 9F.

Figure 9A:
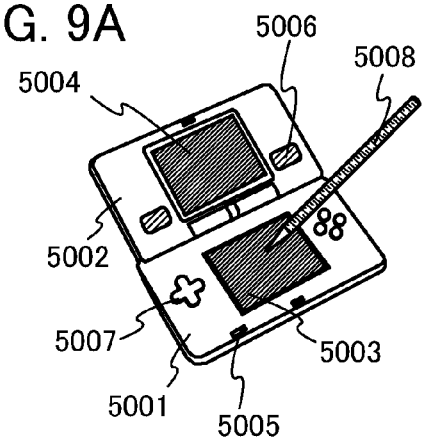
FIGS. 9A to 9F are diagrams each illustrating an electronic device.

FIG. 9A illustrates a portable game machine, which includes a housing 5001, a housing 5002, a display portion 5003, a display portion 5004, a microphone 5005, speakers 5006, operation keys 5007, a stylus 5008, and the like. A semiconductor device of one embodiment of the present invention can be used for the display portion 5003, the display portion 5004, or a circuit in another portion. Although the portable game machine in FIG. 9A has the two display portions 5003 and 5004, the number of display portions included in a portable game machine is not limited to this.

Figure 9B:
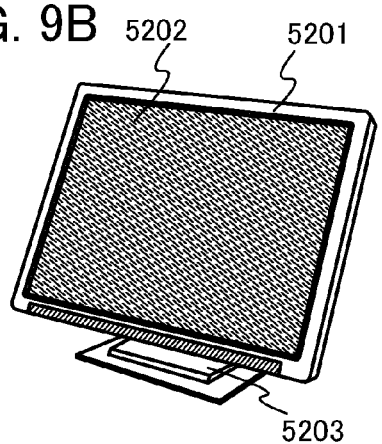

FIG. 9B illustrates a display device, which includes a housing 5201, a display portion 5202, a support 5203, and the like. A semiconductor device of one embodiment of the present invention can be used for the display portion 5202 or a circuit in another portion. Note that a display device includes, in its category, any display device for displaying information, such as display devices for personal computers, TV broadcast reception, and advertisement.

Figure 9C:
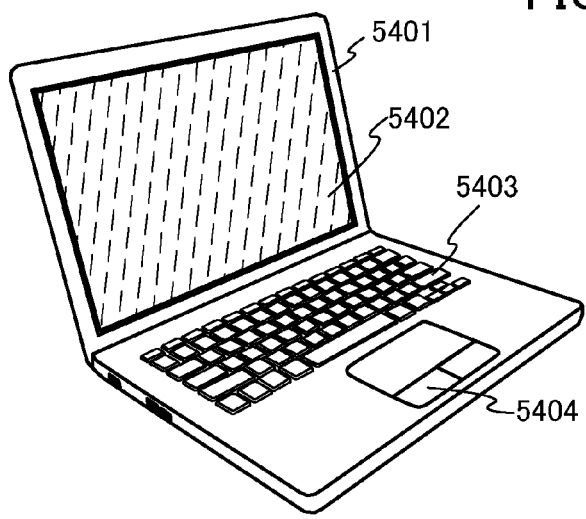

FIG. 9C illustrates a laptop, which includes a housing 5401, a display portion 5402, a keyboard 5403, a pointing device 5404, and the like. A semiconductor device of one embodiment of the present invention can be used for the display portion 5402 or a circuit in another portion.

Figure 9D:
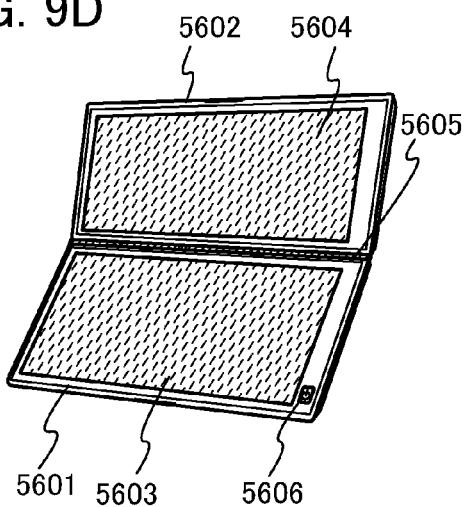

FIG. 9D illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. Images on the first display portion 5603 may be switched in accordance with the angle at the joint 5605 between the first housing 5601 and the second housing 5602. A semiconductor device of one embodiment of the present invention can be used for the first display portion 5603, the second display portion 5604, or a circuit in another portion. A semiconductor device with a position input function may be used as at least one of the first display portion 5603 and the second display portion 5604. Note that the position input function can be added by providing a touch panel in a semiconductor device. Alternatively, the position input function can be added by providing a photoelectric conversion element called a photosensor in a pixel area of a semiconductor device.

Figure 9E:
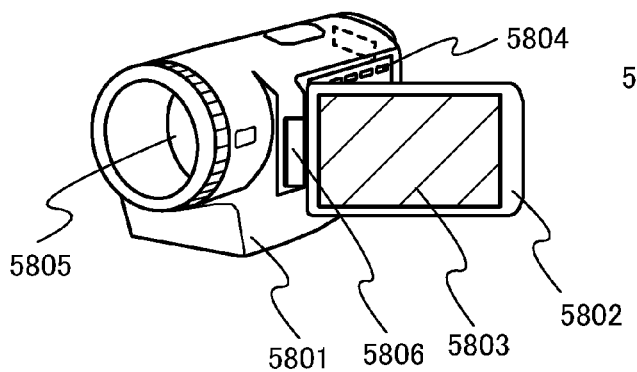

FIG. 9E illustrates a video camera, which includes a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The first housing 5801 is connected to the second housing 5802 by the joint 5806, and the angle between the first housing 5801 and the second housing 5802 can be changed by the joint 5806. Images on the display portion 5803 may be switched in accordance with the angle at the joint 5806 between the first housing 5801 and the second housing 5802. A semiconductor device of one embodiment of the present invention can be used for the display portion 5803 or a circuit in another portion.

Figure 9F:
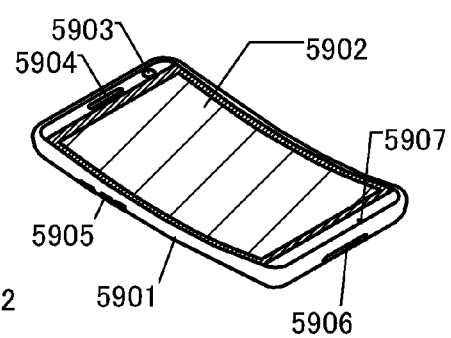

FIG. 9F illustrates a mobile phone in which a housing 5901 is provided with a display portion 5902, a microphone 5907, a speaker 5904, a camera 5903, an external connection portion 5906, and an operation button 5905. A semiconductor device of one embodiment of the present invention can be used for a circuit included in the mobile phone. Further, in the case of forming a semiconductor liquid crystal display device which is one of semiconductor devices of one embodiment of the present invention over a flexible substrate, the semiconductor liquid crystal display device can be applied to the display portion 5902 having a curved surface, which is illustrated in FIG. 9F.

This embodiment can be implemented combining with any of the other embodiments as appropriate.

REFERENCE NUMERALS

60: panel, 61: pixel portion, 62: pixel, 63: scan line driver circuit, 64: signal line driver circuit, 65: liquid crystal element, 66: transistor, 67: capacitor, 70: transistor, 71: transistor, 72: capacitor, 73: light-emitting element, 100: transistor, 101: substrate, 102: semiconductor film, 102a: oxide semiconductor film, 102b: oxide semiconductor film, 102c: oxide semiconductor film, 103a: conductive film, 103b: conductive film, 104: gate insulating film, 104a: protective film, 104b: insulating film, 104c: protective film, 105: conductive film, 106: insulating film, 120: insulating film, 120a: protective film, 120b: insulating film, 120c: protective film, 121: conductive film, 200: transistor, 401: transistor, 402: transistor, 403: transistor, 404: semiconductor substrate, 405: element isolation insulating film, 406: p-well, 407: impurity region, 408: impurity region, 409: gate electrode, 410: impurity region, 411: impurity region, 412: gate electrode, 413: insulating film, 414: wiring, 418: wiring, 419: wiring, 420: insulating film, 421: wiring, 422: wiring, 423: wiring, 424: insulating film, 427: gate insulating film, 430: semiconductor film, 431: gate insulating film, 432: conductive film, 433: conductive film, 434: gate electrode, 435: wiring, 436: insulating film, 442: wiring, 443: wiring, 444: wiring, 4001: substrate, 4005: sealant, 4006: substrate, 4007: liquid crystal layer, 4010: transistor, 4011: liquid crystal element, 4014: wiring, 4015: wiring, 4016: terminal, 4018: FPC, 4019: anisotropic conductive film, 4030: pixel electrode, 4031: common electrode, 4035: spacer, 4040: blocking film, 4041: coloring layer, 4101: substrate, 4105: sealant, 4106: substrate, 4108: transistor, 4110: transistor, 4111: light-emitting element, 4114: wiring, 4115: wiring, 4116: terminal, 4118: FPC, 4119: anisotropic conductive film, 4129: EL layer, 4130: pixel electrode, 4131: common electrode, 5001: housing, 5002: housing, 5003: display portion, 5004: display portion, 5005: microphone, 5006: speaker, 5007: operation key, 5008: stylus, 5201: housing, 5202: display portion, 5203: support, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, 5806: joint, 5901: housing, 5902: display portion, 5903: camera, 5904: speaker, 5905: button, 5906: external connection portion, 5907: microphone This application is based on Japanese Patent Application serial no. 2012-250989 filed with Japan Patent Office on Nov. 15, 2012, the entire contents of which are hereby incorporated by reference.

The invention claimed is:

1. A semiconductor device comprising a transistor comprising:
    an oxide semiconductor film;
    a first conductive film electrically connected to the oxide semiconductor film;
    a second conductive film electrically connected to the oxide semiconductor film;
    a first insulating film over the oxide semiconductor film, the first conductive film, and the second conductive film;
    a second insulating film over the first insulating film;
    a third insulating film over the second insulating film; and
    a third conductive film as a gate electrode of the transistor over the third insulating film,
    wherein the first insulating film and the third insulating film each comprise an oxide including silicon or an oxide including aluminum, and
    wherein the second insulating film comprises an oxide including gallium, an oxide including zirconium, or an oxide including hafnium.

2. The semiconductor device according to claim 1,
    wherein the first insulating film and the third insulating film each comprise silicon oxide, and
    wherein the second insulating film comprises hafnium oxide.

3. The semiconductor device according to claim 1,
    wherein the oxide semiconductor film comprises at least one of indium, gallium, and zinc.

4. The semiconductor device according to claim 1,
    wherein the first conductive film and the second conductive film each comprise at least one of molybdenum, titanium, chromium, tantalum, tungsten, aluminum, copper, neodymium, scandium, and niobium.

5. The semiconductor device according to claim 1,
    wherein the third conductive film comprises at least one of aluminum, titanium, chromium, cobalt, nickel, copper, yttrium, zirconium, molybdenum, ruthenium, silver, tantalum, and tungsten.

6. The semiconductor device according to claim 1,
    wherein the first conductive film and the second conductive film are over the oxide semiconductor film.

7. The semiconductor device according to claim 1, further comprising a fourth conductive film under the oxide semiconductor film with a fourth insulating film interposed between the oxide semiconductor film and the fourth conductive film.

8. A semiconductor device comprising a transistor comprising:
    a first conductive film as a gate electrode of the transistor;
    a first insulating film over the first conductive film;
    a second insulating film over the first insulating film;
    a third insulating film over the second insulating film;
    an oxide semiconductor film over the third insulating film;
    a second conductive film electrically connected to the oxide semiconductor film; and
    a third conductive film electrically connected to the oxide semiconductor film,
    wherein the first insulating film and the third insulating film each comprise an oxide including silicon or an oxide including aluminum, and
    wherein the second insulating film comprises an oxide including gallium, an oxide including zirconium, or an oxide including hafnium.

9. The semiconductor device according to claim 8,
    wherein the first insulating film and the third insulating film each comprise silicon oxide, and
    wherein the second insulating film comprises hafnium oxide.

10. The semiconductor device according to claim 8,
    wherein the oxide semiconductor film comprises at least one of indium, gallium, and zinc.

11. The semiconductor device according to claim 8,
    wherein the first conductive film and the second conductive film each comprise at least one of molybdenum, titanium, chromium, tantalum, tungsten, aluminum, copper, neodymium, scandium, and niobium.

12. The semiconductor device according to claim 8,
    wherein the third conductive film comprises at least one of aluminum, titanium, chromium, cobalt, nickel, copper, yttrium, zirconium, molybdenum, ruthenium, silver, tantalum, and tungsten.

13. The semiconductor device according to claim 8,
    wherein the first conductive film and the second conductive film are over the oxide semiconductor film.

14. A semiconductor device comprising a transistor comprising:
    an oxide semiconductor film;
    a first conductive film electrically connected to the oxide semiconductor film;
    a second conductive film electrically connected to the oxide semiconductor film;
    a first insulating film over the oxide semiconductor film, the first conductive film, and the second conductive film, the first insulating film comprising silicon oxide;
    a second insulating film over the first insulating film, the second insulating film comprising hafnium oxide;
    a third insulating film over the second insulating film, the third insulating film comprising aluminum oxide; and
    a third conductive film as a gate electrode of the transistor over the third insulating film.

15. The semiconductor device according to claim 14,
    wherein the oxide semiconductor film comprises at least one of indium, gallium, and zinc.

16. The semiconductor device according to claim 14,
    wherein the first conductive film and the second conductive film each comprise at least one of molybdenum, titanium, chromium, tantalum, tungsten, aluminum, copper, neodymium, scandium, and niobium.

17. The semiconductor device according to claim 14,
    wherein the first conductive film and the second conductive film are over the oxide semiconductor film.

* * * * *